US008883648B1

(12) United States Patent
Hsieh et al.

(10) Patent No.: US 8,883,648 B1
(45) Date of Patent: Nov. 11, 2014

(54) MANUFACTURING METHOD OF SEMICONDUCTOR STRUCTURE

(71) Applicant: United Microelectronics Corp., Hsinchu (TW)

(72) Inventors: Ming-Da Hsieh, Kaohsiung (TW); Yu-Tsung Lai, Taichung (TW); Hsuan-Hsu Chen, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/020,948

(22) Filed: Sep. 9, 2013

(51) Int. Cl.
*H01L 21/311* (2006.01)
*H01L 21/033* (2006.01)
*H01L 21/768* (2006.01)
*H01L 21/00* (2006.01)

(52) U.S. Cl.
CPC ...... *H01L 21/76802* (2013.01); *H01L 21/0337* (2013.01); *H01L 21/0338* (2013.01); *H01L 21/76879* (2013.01)
USPC ..... 438/703; 438/689; 438/704; 257/E23.011

(58) Field of Classification Search
None
See application file for complete search history.

(56) References Cited

U.S. PATENT DOCUMENTS

| | | | | |
|---|---|---|---|---|
| 4,256,514 A | * | 3/1981 | Pogge | 438/361 |
| 4,325,182 A | * | 4/1982 | Tefft et al. | 438/465 |
| 4,801,350 A | * | 1/1989 | Mattox et al. | 438/702 |
| 4,830,975 A | * | 5/1989 | Bovaird et al. | 438/589 |
| 4,838,991 A | * | 6/1989 | Cote et al. | 216/46 |
| 4,871,630 A | * | 10/1989 | Giammarco et al. | 430/14 |
| 5,296,410 A | * | 3/1994 | Yang | 438/696 |
| 5,411,824 A | * | 5/1995 | Vasudev et al. | 430/5 |
| 5,418,095 A | * | 5/1995 | Vasudev et al. | 430/5 |
| 5,710,066 A | * | 1/1998 | Okamoto et al. | 216/46 |
| 5,882,535 A | * | 3/1999 | Stocks et al. | 216/18 |
| 5,895,740 A | * | 4/1999 | Chien et al. | 430/313 |
| 6,261,962 B1 | * | 7/2001 | Bhardwaj et al. | 438/702 |
| 6,368,974 B1 | * | 4/2002 | Tsai et al. | 438/695 |
| 6,750,150 B2 | | 6/2004 | Chung et al. | |
| 6,770,209 B2 | * | 8/2004 | Snyder et al. | 216/22 |
| 6,864,184 B1 | * | 3/2005 | Gabriel | 438/725 |
| 6,877,213 B2 | * | 4/2005 | Zolla | 29/603.12 |
| 7,033,948 B2 | * | 4/2006 | Chung et al. | 438/706 |
| 7,250,371 B2 | * | 7/2007 | Kang et al. | 438/696 |
| 7,449,230 B2 | | 11/2008 | Sabnis et al. | |
| 7,541,291 B2 | * | 6/2009 | Kang et al. | 438/717 |
| 7,695,632 B2 | * | 4/2010 | Lee et al. | 216/41 |
| 7,772,122 B2 | * | 8/2010 | Cirigliano et al. | 438/696 |
| 8,053,897 B2 | * | 11/2011 | Lerner | 257/773 |
| 8,172,948 B2 | * | 5/2012 | Heo et al. | 118/715 |
| 8,268,118 B2 | * | 9/2012 | Lee et al. | 156/345.38 |
| 8,377,820 B2 | * | 2/2013 | Werner et al. | 438/638 |
| 8,501,395 B2 | * | 8/2013 | Dai et al. | 430/323 |
| 8,614,149 B2 | * | 12/2013 | Lee et al. | 438/702 |
| 8,741,552 B2 | * | 6/2014 | Chen et al. | 430/323 |

(Continued)

*Primary Examiner* — Charles Garber
*Assistant Examiner* — Evren Seven
(74) *Attorney, Agent, or Firm* — WPAT, PC; Justin King

(57) ABSTRACT

A manufacturing method of a semiconductor structure is disclosed. The manufacturing method includes the following steps: providing an underlying layer; forming a tri-layered photoresist on the underlying layer, which comprises forming a bottom photoresist layer on the underlying layer, forming a silicon-containing material layer on the bottom photoresist layer, and forming a patterned photoresist layer on the silicon-containing material layer; performing an atomic layer deposition (ALD) process for forming a thin layer on the tri-layered photoresist; and performing an etching process for forming a via hole, which comprises etching the silicon-containing material layer according to the thin layer on the tri-layered photoresist.

20 Claims, 5 Drawing Sheets

(56) References Cited

U.S. PATENT DOCUMENTS

2007/0284690 A1* 12/2007 Sadjadi et al. ................ 257/499
2009/0130850 A1* 5/2009 Lee ................................ 438/694
2009/0191711 A1* 7/2009 Rui et al. ...................... 438/695
2012/0244710 A1* 9/2012 Chumakov et al. ........... 438/701

* cited by examiner

MANUFACTURING METHOD OF SEMICONDUCTOR STRUCTURE

BACKGROUND

1. Technical Field

The disclosure relates in general to a manufacturing method of a semiconductor structure, and more particularly to a manufacturing method of a semiconductor structure including a thin layer formed by an atomic layer deposition (ALD) process.

2. Description of the Related Art

Due to the increasing need for high-density integrated circuits, the dimensions of circuit patterns in integrated circuits get smaller, and methods of reducing sizes of patterns are developed and utilized in the fabricating processes of integrated circuits. However, high-resolution photolithographic processes are usually very complicated, and it is very difficult to control the fabrication processes as well.

Therefore, there is a need for an improved and simplified process for fabricating patterns with reduced sizes in integrated circuits.

SUMMARY OF THE INVENTION

The disclosure is directed to a manufacturing method of a semiconductor structure. In the embodiments, with a thin layer formed by an atomic layer deposition (ALD) process on a patterned photoresist of the semiconductor structure, the critical dimension in the patterned photoresist is reduced, and the critical dimension of a via hole formed according to the thin layer on the patterned photoresist is reduced as well.

According to an embodiment of the present disclosure, a manufacturing method of a semiconductor structure is disclosed. The manufacturing method includes the following steps: providing an underlying layer; forming a tri-layered photoresist on the underlying layer, which comprises forming a bottom photoresist layer on the underlying layer, forming a silicon-containing material layer on the bottom photoresist layer, and forming a patterned photoresist layer on the silicon-containing material layer; performing an atomic layer deposition (ALD) process for forming a thin layer on the tri-layered photoresist; and performing an etching process for forming a via hole, which comprises etching the silicon-containing material layer according to the thin layer on the tri-layered photoresist.

According to another embodiment of the present disclosure, a manufacturing method of a semiconductor structure is disclosed. The manufacturing method includes the following steps: providing an underlying layer; forming a multi-layered photoresist on the underlying layer, which comprises forming a hard mask layer on the underlying layer and forming a patterned photoresist layer on the hard mask layer; performing a first etching process, comprising: etching the hard mask layer according to the patterned photoresist layer for forming a patterned hard mask layer; performing an atomic layer deposition (ALD) process for forming a thin layer on the patterned hard mask layer; and performing a second etching process for forming a via hole, which comprises etching the underlying layer according to the thin layer on the patterned hard mask layer.

The disclosure will become apparent from the following detailed description of the preferred but non-limiting embodiments. The following description is made with reference to the accompanying drawings.

DETAILED DESCRIPTION OF THE INVENTION

Figure 1A:
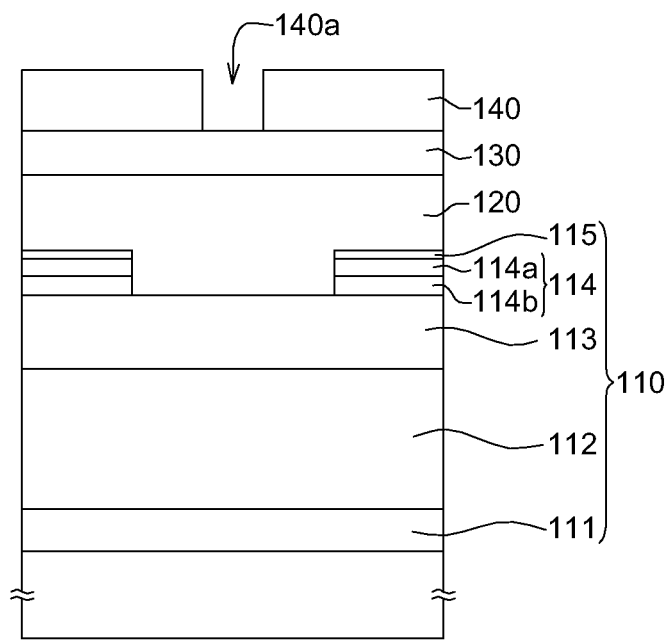
FIGS. 1A-1D illustrate a manufacturing method of a semiconductor structure according to an embodiment of the present disclosure.

In the embodiments, with a thin layer formed by an atomic layer deposition (ALD) process on a patterned photoresist of a semiconductor structure, the critical dimension in the patterned photoresist is reduced, and the critical dimension of a via hole formed according to the thin layer on the patterned photoresist is reduced as well. The embodiments are described in details with reference to the accompanying drawings. The procedures and details of the method of the embodiments are for exemplification only, not for limiting the scope of protection of the disclosure. Moreover, the identical elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense.

Referring to FIGS. 1A-1D, a manufacturing method of a semiconductor structure 100 according to an embodiment of the present disclosure is illustrated. As shown in FIG. 1A, an underlying layer 110 is provided, and a tri-layered photoresist is formed on the underlying layer 110. The tri-layered photoresist comprises a bottom photoresist layer 120, a silicon-containing material layer 130, and a patterned photoresist layer 140.

In the embodiment, providing the underlying layer 110 includes, such as, forming a diffusion barrier 111, forming a dielectric layer 112 on the diffusion barrier 111, forming a SiON layer 113 on the dielectric layer 112, forming a patterned layer 114 on the SiON layer 113, and forming a cap oxide 115 layer on the patterned layer 114. In the present embodiment, the diffusion barrier 111 may be an etching stop layer as well, and the material of the diffusion barrier 111 may comprise nitrogen-doped silicon carbide (NDC). The dielectric layer 112 may comprise an ultra-low-k (ULK) material. The patterned layer 114 may be a patterned hard mask, including a TiN layer 114a and a Ti layer 114b.

As shown in FIG. 1A, the manufacturing process of forming the tri-layered photoresist includes such as the following steps. The bottom photoresist layer 120 is formed on the underlying layer 110, the silicon-containing material layer 130 is formed on the bottom photoresist layer 120, and the patterned photoresist layer 140 is formed on the silicon-containing material layer 130.

In the present embodiment, the bottom photoresist layer 120 comprises at least an etching resistive layer or an I-line photoresist, the silicon-containing material layer 130 is such as a silicon-containing hard-mask bottom anti-reflection coating (SHB), and the patterned photoresist 140 is such as an ArF photoresist. In the present embodiment, the patterned photoresist 140 is formed by such as a photolithography process, and the patterned photoresist layer 140 has a first through hole 140a.

Figure 1B:
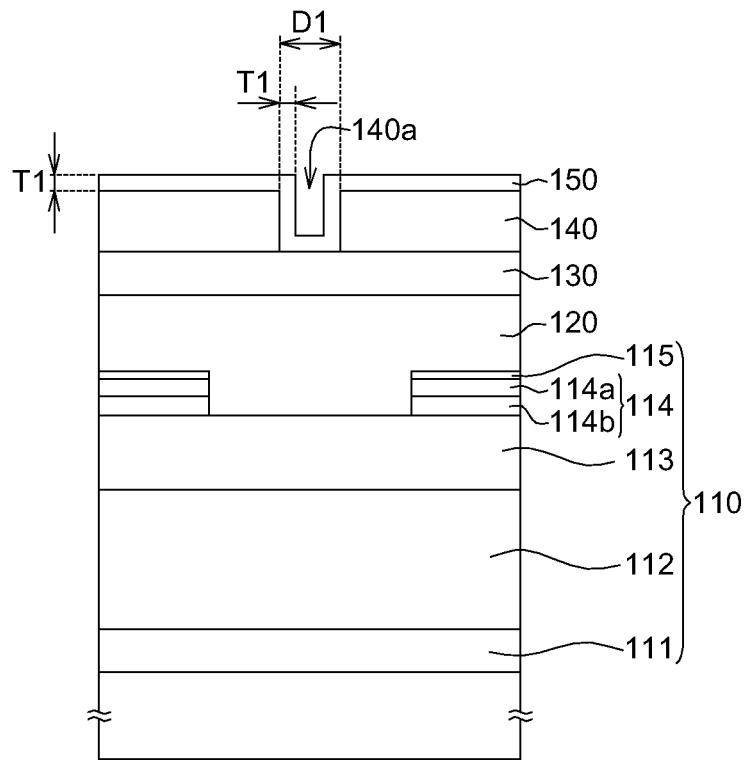

Referring to FIG. 1B, an atomic layer deposition (ALD) process is performed for forming a thin layer 150 on the tri-layered photoresist. For example, the ALD process is performed to the patterned photoresist 140 for forming the thin layer 150. By the ALD process, as shown in FIG. 1B, the thickness T1 of the thin layer 150 is uniform. For example, the thickness T1 of the thin layer 150 on the top surface of the patterned photoresist 140 as well as on the sidewalls of the first through hole 140a is uniform.

In the embodiment, as shown in FIG. 1B, the first through hole 140a of the patterned photoresist layer 140 has a first critical dimension (CD) D1. With the formation of the thin layer 150 by the ALD process on the sidewalls of the first through hole 140a, the resulting critical dimension of the first through hole 140a covered by the thin layer 150 is reduced by at least two times the thickness T1. As such, the critical dimension in the patterned photoresist layer 140 covered by the thin layer 150 is reduced.

In the present embodiment, the thickness T1 of the thin layer 150 formed by the ALD process is equal to or less than 15 nm, preferably, equal to or less than 10 nm. That is, the resulting critical dimension of the first through hole 140a covered by the thin layer 150 is reduced by about 20-30 nm.

Figure 1C:
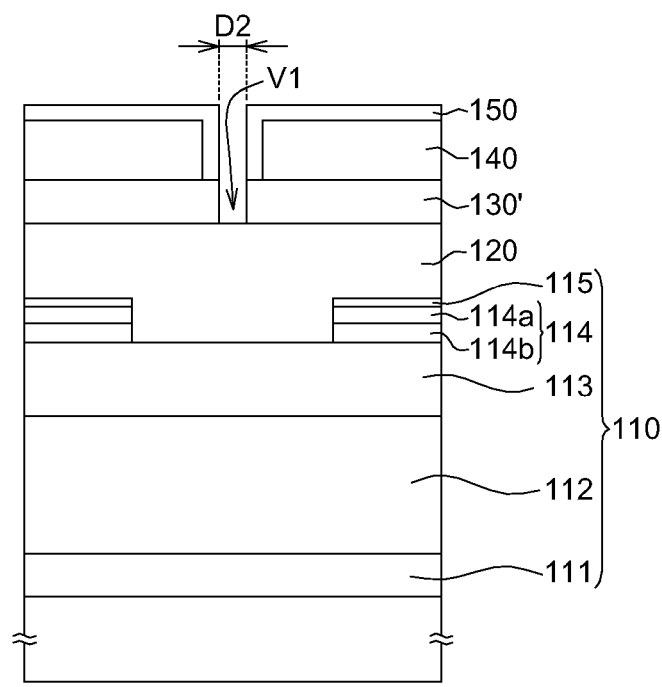

Referring to FIG. 1C, an etching process is performed for forming a via hole, and the etching process includes etching the silicon-containing material layer 130 according to the thin layer 150 on the tri-layered photoresist. As shown in FIG. 1C, the etched silicon-containing material layer 130' forms a via hole V1 extending to the top surface of the bottom photoresist layer 120. Due to the reduced critical dimension in the patterned photoresist layer 140 by the thickness T1 of the thin layer 150, the critical dimension D2 of the via hole V1 is reduced as well.

Figure 1D:
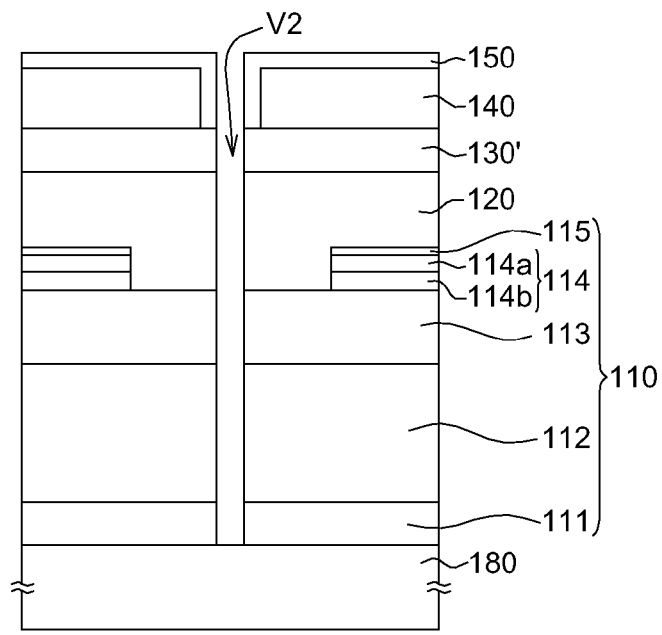

Referring to FIG. 1D, the etching process may further comprise etching the underlying layer 110 according to the thin layer 150 on the tri-layered photoresist. The etched tri-layered photoresist along with the etched silicon-containing material layer 130' forms a via hole V2, which may, for example, extend to the top surface of a layer 180 below the diffusion barrier 111. In the present embodiment, the step of etching the silicon-containing material layer 130 is prior to the step of etching the underlying layer 110. In an alternative embodiment, the step of etching the silicon-containing material layer 130 and the step of etching the underlying layer 110 may be performed in a single manufacturing step. As such, the semiconductor structure 100 is formed.

Next, in an embodiment, a conductive material may be further filled into the via hole V2 for forming a via contact (not shown in figures).

Figure 2:
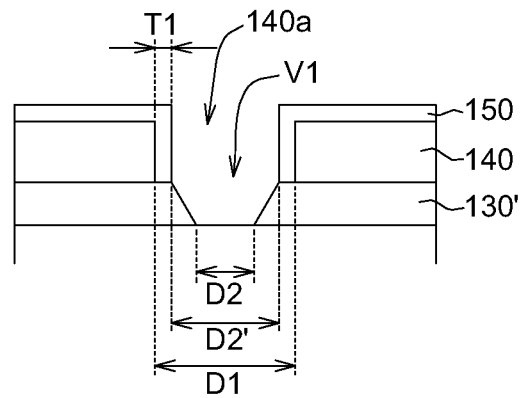
FIG. 2 illustrates a manufacturing process of etching the silicon-containing material layer according to the thin layer according to an embodiment of the present disclosure.

Referring to FIG. 2, a manufacturing process of etching the silicon-containing material layer according to the thin layer according to an embodiment of the present disclosure is illustrated. Referring to FIG. 2, the first critical dimension D1 of the first through hole 140a of the patterned photoresist layer 140 is shown. In the present embodiment, the thickness T1 of the thin layer 150 is adjustable and determined according to the first critical dimension D1 and an etching bias from the etching process. The etching bias is defined as the difference in critical dimensions in the silicon-containing material layer before and after performing the etching process. That is, since the first critical dimension D1 of the first through hole 140a may vary depending on the photolithography process performed for forming the first through hole 140a, the critical dimension D2 of the via hole V1 is predetermined to be a fixed value, and the etching process generates the etching bias; accordingly, the thickness T1 of the thin layer 150 is adjustable and determined according to the first critical dimension D1 of the first through hole 140a and the etching bias. In other words, in the embodiment, the thickness T1 of the thin layer 150 may be controlled by an advanced process control (APC) system according to the first critical dimension D1 of the first through hole 140a and the etching bias from the etching process.

As shown in FIG. 2, the etched silicon-containing material layer 130' forms a tapered-shaped via hole V1, the etching bias B is defined as the difference between the critical dimension D2' before the etching process and the critical dimension D2 after the etching process in the silicon-containing material layer 130'. In the present embodiment, the thickness T1 of the thin layer 150 can be determined according to the formula: $T1 = 1/2 * (D1 - D2 - B)$. For example, the first critical dimension D1 of the first through hole 140a is 72 nm, the critical dimension D2 of the via hole V1 is predetermined to be 42 nm, the etching bias B is 20 nm, and accordingly, the thickness T1 of the thin layer 150 is equal to $1/2*(72-42-20)=5$ nm. In an alternative example, when the first critical dimension D1 of the first through hole 140a is 70 nm, the critical dimension D2 of the via hole V1 is predetermined to be 42 nm, the etching bias B is 20 nm, and accordingly, the thickness T1 of the thin layer is equal to $1/2*(70-42-20)=4$ nm.

In summary, when a plurality of via holes V1 are manufactured, since the first critical dimension D1 of the first through holes 140a may vary depending on the photolithography process performed for forming the first through holes 140a, the thickness T1 of the thin layer 150 determined according to the above-mentioned advanced process control system can provide the via holes V1 with uniform sizes, regardless of the variation of the critical dimensions D1.

Figure 3A:
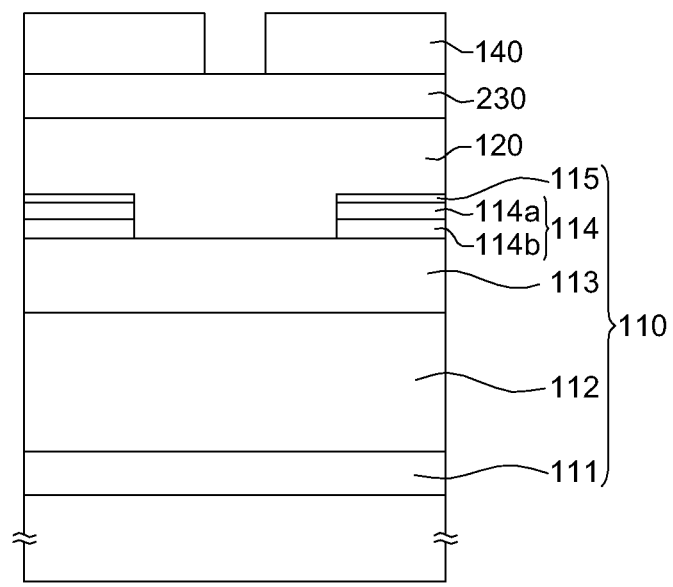
FIGS. 3A-3D illustrate a manufacturing method of the semiconductor structure according to another embodiment of the present disclosure.

Referring to FIGS. 3A-3D, a manufacturing method of the semiconductor structure 200 according to another embodiment of the present disclosure is illustrated. It is noted that the identical elements of the embodiments are designated with the same reference numerals, and the similarities are not repeated here. As shown in FIG. 3A, the underlying layer 110 is provided.

As shown in FIG. 3A, a multi-layered photoresist is formed on the underlying layer 110. The manufacturing process of forming the multi-layered photoresist includes such as the following steps: forming a hard mask layer on the underlying layer 110 and forming the patterned photoresist layer 140 on the hard mask layer. The patterned photoresist layer 140 has a first through hole 140a.

In the embodiments of the present disclosure, the hard mask layer comprises at least one of a silicon-containing material layer, a bottom anti-reflective coating (BARC), or a bottom photoresist layer 120. In the present embodiment, the hard mask layer is a silicon-containing material layer 230.

Figure 3B:
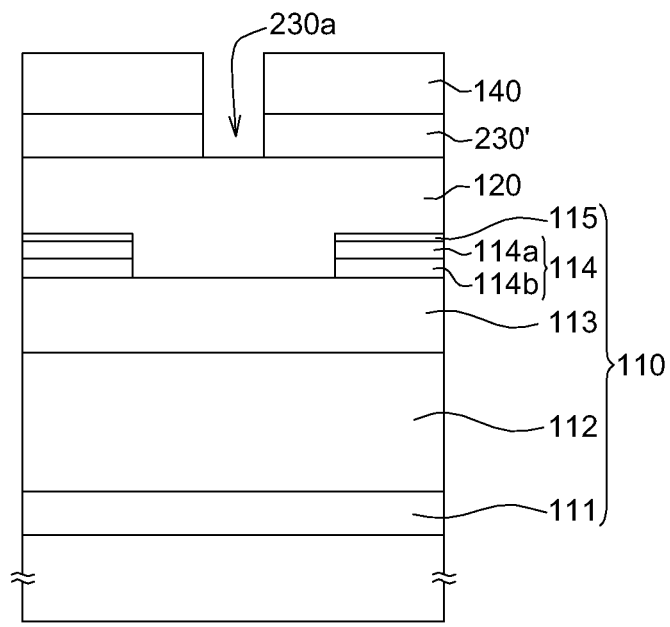

Referring to FIG. 3B, a first etching process is performed for forming a patterned hard mask layer 230'. In the present embodiment, forming the patterned hard mask layer 230' is by such as etching the hard mask layer (silicon-containing material layer 230) according to the patterned photoresist layer 140, and a second through hole 230a is formed within the patterned hard mask layer 230'.

In an alternative embodiment, the hard mask layer comprises the silicon-containing material layer 230 and the bottom photoresist layer 120, and the first etching process is performed to both of the silicon-containing material layer 230 and the bottom photoresist layer 120 for forming a patterned hard mask layer with a second through hole formed there-within and extending to the top surface of the underlying layer 110 (not shown in figures). It is to be noted that the patterned hard mask layer 230' (patterned silicon-containing material layer) as shown in FIGS. 3B-3D and 4 is taken as an example for illustrating the following processes; however, the following processes may also be performed to the patterned hard mask layer comprising at least one of a patterned silicon-containing material layer, a patterned bottom anti-reflective coating (BARC), or a patterned bottom photoresist layer, of which the patterning is manufactured according to the above-mentioned embodiments.

In a further embodiment, after the first etching process is performed, either to the silicon-containing material layer 230 or to both of the silicon-containing material layer 230 and the bottom photoresist layer 120, the patterned photoresist layer 140 may be further removed before the following manufacturing process is performed (not shown in figures).

Figure 3C:
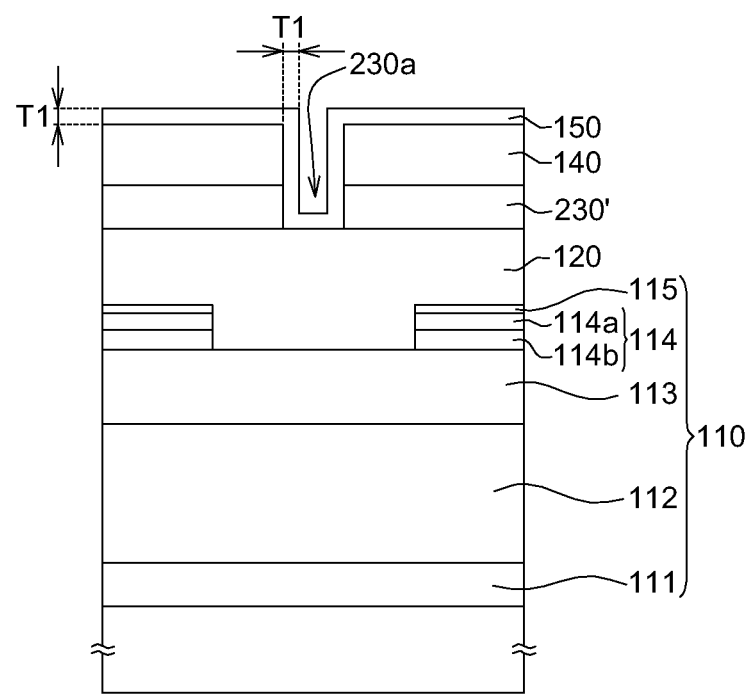

Referring to FIG. 3C, an atomic layer deposition process is performed for forming a thin layer 150 on the patterned hard mask layer 230'. For example, in the present embodiment, as shown in FIG. 3C, the ALD process is performed to the patterned photoresist 140 and the patterned hard mask layer 230' for forming the thin layer 150 on the patterned photoresist 140 and in the second through hole 230a of the patterned hard mask layer 230'. By the ALD process, as shown in FIG. 3C, the thickness T1 of the thin layer 150 on the top surface of the patterned photoresist 140 as well as on the sidewalls of the second through hole 230a is uniform. With the formation of the thin layer 150 by the ALD process on the sidewalls of the second through hole 230a, the resulting critical dimension of the second through hole 230a covered by the thin layer 150 is reduced by at least two times the thickness T1. As such, the critical dimension in the patterned hard mask layer 230' covered by the thin layer 150 is reduced.

In an alternative embodiment, with the patterned photoresist 140 removed, the ALD process may be performed to the patterned hard mask layer for forming the thin layer 150 on the patterned hard mask layer and in the second through hole of the patterned hard mask layer (not shown in figures).

Figure 3D:
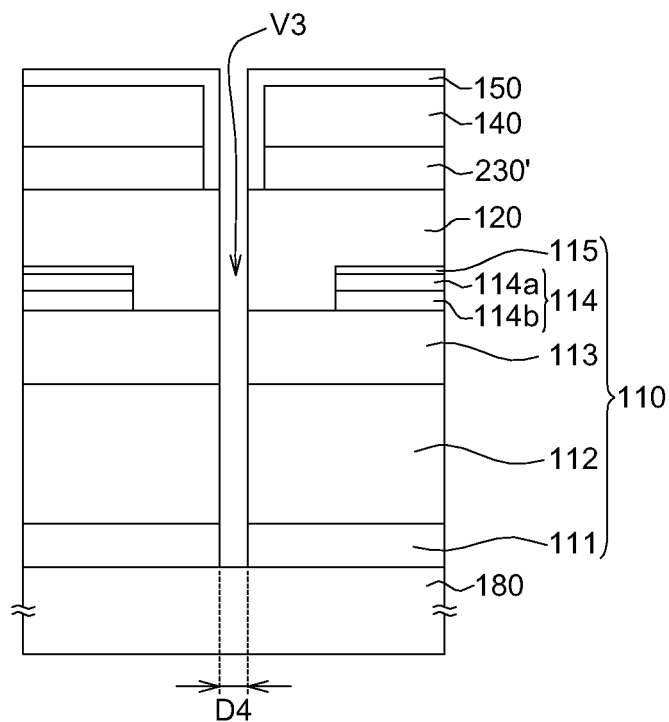

Referring to FIG. 3D, a second etching process is performed for forming a via hole V3. In the present embodiment, the second etching process includes etching the underlying layer 110 according to the thin layer 150 on the patterned hard mask layer 230'. As shown in FIG. 3D, the via hole V3 may extend to the top surface of the layer 180 below the diffusion barrier 111. Due to the reduced critical dimension in the patterned hard mask layer 230' by the thickness T1 of the thin layer 150, the critical dimension D4 of the via hole V3 is reduced as well. As such, the semiconductor structure 200 is formed.

Next, in an embodiment, a conductive material may be further filled into the via hole V3 for forming a via contact (not shown).

Figure 4:
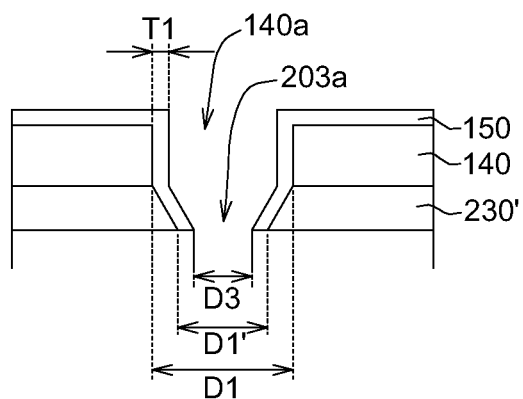
FIG. 4 illustrates a manufacturing process of applying an advanced process control system for determining the thickness of the thin layer in the semiconductor structure according to an embodiment of the present disclosure.

Referring to FIG. 4, a manufacturing process of applying an advanced process control system for determining the thickness T1 of the thin layer 150 in the semiconductor structure 200 according to an embodiment of the present disclosure is illustrated. As shown in FIG. 4, in the present embodiment, the thickness T1 of the thin layer 150 is adjustable and determined according to the first critical dimension D1 of the patterned photoresist layer 140 and a first etching bias from the first etching process. The first etching bias is defined as the difference in critical dimensions in the patterned hard mask layer 230' before and after performing the first etching process. That is, since the first critical dimension D1 of the first through hole 140a may vary depending on the photolithography process performed for forming the first through hole 140a, the critical dimension D3 of the second through hole 230a is predetermined to be a fixed value, and the first etching process generates the first etching bias; accordingly, the thickness T1 of the thin layer 150 is adjustable and determined according to the first critical dimension D1 of the first through hole 140a and the first etching bias. In other words, in the embodiment, the thickness T1 of the thin layer 150 may be controlled by an advanced process control system according to the first critical dimension D1 of the first through hole 140a and the first etching bias.

As shown in FIG. 4, the second through hole 230a of the patterned hard mask layer 230' has a tapered shape, the first etching bias B1 is defined as the difference between the critical dimension D1 before the first etching process and the critical dimension D1' after the first etching process in the patterned hard mask layer 230'. In the present embodiment, the thickness T1 of the thin layer 150 can be determined according to the formula: $T1 = 1/2 * (D1 - D3 - B1)$.

In a further embodiment, the second through hole 230a of the patterned hard mask layer 230' may have a second critical dimension, and the thickness T1 of the thin layer 150 may be determined according to the second critical dimension and a second etching bias from the second etching process. In the present embodiment, the second etching bias is defined as the difference in critical dimensions in the underlying layer 110 before and after performing the second etching process.

For example, the second critical dimension may be the critical dimension D3 as shown in FIG. 4. However, the critical dimension D3 is not predetermined to be as a fixed value in the present embodiment; on the contrary, the second critical dimension of the second through hole 230a may vary depending on the manufacturing process thereof. Referring to FIGS. 3D and 4, with the critical dimension D4 of the via hole V3 predetermined at a fixed value, the thickness T1 of the thin layer 150 is adjusted and determined according to the second critical dimension (critical dimension D3), the second etching bias from the second etching process performed to the underlying layer 110, and the predetermined value of the critical dimension D4 of the via hole V3.

Moreover, in an embodiment, when an advanced process control system is applied for controlling the thickness T1 of the thin layer 150, with two etching processes performed separately, the thickness T1 of the thin layer 150 may be further determined according to the predetermined critical dimension D4 of the via hole V3, the initial critical dimension D1 within the patterned photoresist layer 140, and the two etching biases from the two etching processes.

In summary, when a plurality of via holes V3 are manufactured, since the first critical dimension D1 of the first through holes 140a and/or the second critical dimension of the second through hole 230a may vary depending on the manufacturing processes (e.g. photolithography process) performed for forming the through holes 140a and/or 230a, the thickness T1 of the thin layer 150 determined according to the above-mentioned advanced process control system can provide the via holes V1 and/or V3 with uniform sizes, regardless of the variation of the critical dimensions of the through holes 140a and/or 230a.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a semiconductor structure, comprising:
   providing an underlying layer;
   forming a tri-layered photoresist on the underlying layer, comprising:
   forming a bottom photoresist layer on the underlying layer;
   forming a silicon-containing material layer on the bottom photoresist layer; and
   forming a patterned photoresist layer on the silicon-containing material layer;
   performing an atomic layer deposition (ALD) process for forming a thin layer on the tri-layered photoresist; and
   performing an etching process for forming a via hole, comprising:
   etching the silicon-containing material layer according to the thin layer on the tri-layered photoresist.

2. The manufacturing method according to claim 1, wherein performing the etching process for forming the via hole further comprises:
   etching the underlying layer according to the thin layer on the tri-layered photoresist.

3. The manufacturing method according to claim 2, wherein etching the silicon-containing material layer is prior to etching the underlying layer.

4. The manufacturing method according to claim 1, wherein the patterned photoresist layer has a first through hole with a first critical dimension (CD), and the thickness of the thin layer is determined according to the first critical dimension and an etching bias from the etching process.

5. The manufacturing method according to claim 1, wherein the bottom photoresist layer comprises at least an etching resistive layer or an I-line photoresist.

6. The manufacturing method according to claim 1, wherein the silicon-containing material layer is a silicon-containing hard-mask bottom anti-reflection coating (SHB).

7. The manufacturing method according to claim 1, wherein the patterned photoresist is an ArF photoresist.

8. The manufacturing method according to claim 1, wherein the thickness of the thin layer formed by the ALD process is equal to or less than 15 nm.

9. The manufacturing method according to claim 1, further comprising: filling a conductive material into the via hole for forming a via contact.

10. The manufacturing method according to claim 1, wherein providing the underlying layer comprises:
    forming a diffusion barrier;
    forming a dielectric layer on the diffusion barrier;
    forming a SiON layer on the dielectric layer;
    forming a patterned layer on the SiON layer; and
    forming a cap oxide layer on the patterned layer.

11. A manufacturing method of a semiconductor structure, comprising:
    providing an underlying layer;
    forming a multi-layered photoresist on the underlying layer, comprising:
    forming a hard mask layer on the underlying layer; and
    forming a patterned photoresist layer on the hard mask layer;
    performing a first etching process, comprising: etching the hard mask layer according to the patterned photoresist layer for forming a patterned hard mask layer;
    performing an atomic layer deposition (ALD) process for forming a thin layer on the patterned hard mask layer; and
    performing a second etching process for forming a via hole, comprising: etching the underlying layer according to the thin layer on the patterned hard mask layer.

12. The manufacturing method according to claim 11, wherein the hard mask layer comprises at least one of a silicon-containing material layer, a bottom anti-reflective coating (BARC), or a bottom photoresist layer.

13. The manufacturing method according to claim 12, wherein the bottom photoresist layer comprises at least an etching resistive layer or an I-line photoresist.

14. The manufacturing method according to claim 12, wherein the silicon-containing material layer is a silicon-containing hard-mask bottom anti-reflection coating (SHB).

15. The manufacturing method according to claim 11, wherein the patterned photoresist layer has a first through hole with a first critical dimension (CD), and the thickness of the thin layer is determined according to the first critical dimension and a first etching bias from the first etching process.

16. The manufacturing method according to claim 11, wherein the patterned hard mask layer has a second through hole with a second critical dimension, and the thickness of the thin layer is determined according to the second critical dimension and a second etching bias from the second etching process.

17. The manufacturing method according to claim 11, wherein the patterned photoresist is an ArF photoresist.

18. The manufacturing method according to claim 11, wherein the thickness of the thin layer formed by the ALD process is equal to or less than 15 nm.

19. The manufacturing method according to claim 11, further comprising: filling a conductive material into the via hole for forming a via contact.

20. The manufacturing method according to claim 11, wherein providing the underlying layer comprises:
    forming a diffusion barrier;
    forming a dielectric layer on the diffusion barrier;
    forming a SiON layer on the dielectric layer;
    forming a patterned layer on the SiON layer; and
    forming a cap oxide layer on the patterned layer.

* * * * *